United States Patent [19]

Luryi

[11] Patent Number: 5,223,723
[45] Date of Patent: Jun. 29, 1993

[54] LIGHT EMITTING DEVICE

[75] Inventor: Sergey Luryi, Bridgewater, N.J.

[73] Assignee: AT&T Bell Laboratories, Murray Hill, N.J.

[21] Appl. No.: 716,751

[22] Filed: Jun. 18, 1991

Related U.S. Application Data

[63] Continuation-in-part of Ser. No. 601,477, Oct. 19, 1990, abandoned.

[51] Int. Cl.$^5$ .............. H01L 29/161; H01L 29/80; H01L 27/02; H01S 3/19
[52] U.S. Cl. .................................. 257/184; 257/187; 257/190; 257/197; 257/200; 257/257; 372/45; 372/50
[58] Field of Search ................ 357/16; 257/184, 187, 257/190, 197, 200, 257; 372/45, 50

[56] References Cited

U.S. PATENT DOCUMENTS

| | | | |
|---|---|---|---|
| 4,686,550 | 8/1987 | Capasso et al. | 357/16 |
| 4,903,092 | 2/1990 | Luryi et al. | 357/22 |
| 4,973,858 | 11/1990 | Chang | 357/16 |
| 4,974,231 | 11/1990 | Gomyo | 357/16 |
| 5,081,633 | 1/1992 | Danner | 357/16 |
| 5,091,756 | 2/1992 | Iga et al. | 357/16 |

FOREIGN PATENT DOCUMENTS 0253174  6/1987  European Pat. Off. .
428848  7/1967  Switzerland .

OTHER PUBLICATIONS

"A Vertical Integration of Laser Diode and Transistor", by H. Yoo et al., Proc. Tencon 87, Seoul, Korea, IEEE Korea/Korea Inst. Electron. Eng., Aug. 25-28, 1987, pp. 1241-1243.
"Optoelectronic Dynamic Random Access Memory Cell Utilizing a Three-Terminal N-channel Self-aligned Double-Heterostructure Optoelectronic Switch", by G. W. Taylor et al., Applied Physics Letters, vol. 54, No. 6, Feb. 6, 1989, New York, pp. 543-545.
European Search Report, Berlin, Dec. 18, 1991.
"Solid State Electronic Devices", by B. G. Streetman, Prentice-Hall, Inc., Englewood Cliffs, N.J. 07632, p. 295.
"Hot-electron Memory Effect in Double-Layered Heterostructures", by S. Luryi et al., Applied Physics Letters, vol. 45, No. 12, Dec. 15, 1984, pp. 1294-1296.
"Hot Electron Injection Devices", by S. Luryi, Superlattices and Microstructures, vol. 1, No. 5, 1985, pp. 389-400.
"Hot-Electron Injection and Resonant-Tunneling Heterojunction Devices", by S. Luryi, AT&T Bell Laboratories, Murray Hill, N.J., Heterojunction (1987). Band Discontinuities: Physics and Device Applications, edited by F. Capasso and G. Margaritondo, pp. 513-537.
"Surface Emitting Semiconductor Lasers", by K. Iga et al., IEEE Journal of Quantum Electronics, vol. 24, No. 9, Sep. 1988, pp. 1845-1855.
"Quantum-Well Semiconductor Lasers", Chap. 9, Long-Wavelength Semiconductor Lasers, by G. P. Agrawal et al., Van Nostrand Reinhold Company, New York, pp. 372-409.
"Room-temperature Photopumped Operation of an InGaAs-InP Vertical Cavity Surface-Emitting Laser", by D. G. Deppe et al., Applied Physics Letters, 56(22), May 28, 1990, pp. 2172-2176.

Primary Examiner—Andrew J. James
Assistant Examiner—Valencia M. Martin
Attorney, Agent, or Firm—Eugen E. Pacher

[57] ABSTRACT

A novel light emitting semiconductor device is disclosed. The device utilizes real space transfer (RST) of carriers, and comprises regions of opposite conductivity type separated by a barrier layer. The first region (termed the "emitter") comprises at least two contacts. Application of appropriate bias between the two contacts and between the emitter and the second region results in injection of hot carriers into the second region, resulting in luminescence in the second region. The invention can be embodied in coherent as well as incoherent light sources. A preferred embodiment is a vertical cavity surface emitting laser. The device can serve as a novel logic element that has electrical inputs and an optical output, and provides a non-trivial logic function.

12 Claims, 2 Drawing Sheets

LIGHT EMITTING DEVICE

This application is a continuation-in-part of application Ser. No. 07/601,477, filed on Oct. 19, 1990, now abandoned.

FIELD OF THE INVENTION

This invention pertains to light emitting semiconductor devices and to articles comprising such a device.

BACKGROUND OF THE INVENTION

Real space transfer (RST) electronic devices are known to the art. See, for instance, "Heterojunction Band Discontinuities: Physics and Device Applications", F. Capasso et al., editors, Elsevier 1987, especially pages 513-537, incorporated herein by reference.

Known RST devices are a transistor, variously called charge-injection transistor (CHINT) or negative resistance field effect transistor (NERFET), and the hot-electron erasable programmable random access memory ($HE^2PRAM$). See, for instance, U.S. Pat. No. 4,903,092, also incorporated herein by reference.

Briefly, the CHINT is a three-terminal device based on real-space transfer of hot electrons from a first to a second conducting region. The two conducting regions are separated by a barrier region and are contacted independently, with the first conducting region having two surface contacts (frequently referred to as "source" and "drain"). Application of a source-to-drain bias $V_{sd}$ can lead to a heating of electrons in the first region and consequent charge injection into the second conducting region. The first region thus acts as a hot electron emitter and the second region as a collector. This terminology will generally be used herein.

A logic circuit that comprises prior art RST devices is known. For instance, on page 520 of the above referenced monograph is disclosed a logic circuit comprising two NERFETs.

Recently a novel RST logic element was disclosed. See U.S. patent application Ser. No. 07/514,078, filed Apr. 25, 1990 for S. Luryi et al., and incorporated herein by reference. The logic element has electrical inputs and an electrical output, and can, inter alia, make possible simplification of logic circuits. It can also make possible self-organizing logic, and can provide a logic function (XNOR) that previously could only be obtained by a combination of logic elements.

Semiconductor light emitting devices are well known. Among them are edge emitting lasers and surface emitting lasers (SELs). For a recent review of SELs, see, for instance, K. Iga et al., *IEEE Journal of Quantum Electronics*, Vol. QE-24, pp. 1845-1855 (1988), incorporated herein by reference. A particular and potentially advantageous type of SEL is known as "vertical cavity" SEL (VCSEL). In current pumped VCSELs the optical cavity is typically formed by two multilayer semiconductor "mirrors", with the injection current by necessity flowing through the mirrors. Typically the mirrors have relatively high electrical resistance, resulting inter alia in undesirable heat dissipation. Since SELs have the potential for significant use in, e.g., optical communications and optical computing, it would be desirable to have available a SEL that is not subject to this and other shortcomings of prior art SELs.

In many present and/or potential applications it is necessary to produce an optical output in response to an electrical input. Frequently the thus created optical signal will serve as an input for a logic element. It would clearly be of interest to have available a device whose optical output in response to electrical input signals can provide a non-trivial logic function (i.e., a logic function other than NOT), such that the light-emitting device is also a logic element. It would be of particular interest if the logic function provided by the element were a function that could previously not be realized with a single logic element.

Below will be disclosed a novel semiconductor light emitting device whose different embodiments can have these and other advantageous properties.

DEFINITIONS

A "logic element" herein is a circuit element that has at least two input terminals and an output terminal. The element accepts binary input signals, performs a predetermined transformation on the input signals, and presents the resulting binary output signal at the output terminal. Examples of logic elements are AND, OR, NAND, NOR, and EXCLUSIVE-NOR (XNOR) elements.

A "logic function" herein is the transformation provided by a logic element. For instance, an AND logic element provides the AND logic function, i.e., its output depends on the inputs in the manner described by the AND truth table.

By the "electrical state" of a logic element is meant herein the totality of electrical signals applied to the input terminals. For a logic element with two input terminals (A,B) a particular electrical state thus ia $A=1$, $B=0$, and a further particular state is $A=0$, $B=1$, where 1 and 0 are used in conventional fashion.

A "light emitting" device herein is a device that emits electromagnetic radiation in response to an electrical input, with the wavelength of the radiation not necessarily being in the visible region of the spectrum. A semiconductor region herein is of a given (i.e., n- or p-) "dopant" conductivity type if the region is doped such that the net doping in the region is of the given conductivity type, i.e. such that the region contains a higher concentration of atoms associated with the given (e.g., n) conductivity type that of atoms associated with the other (e.g., p) conductivity type.

A semiconductor region of a semiconductor device herein will be referred to as being of a given (i.e., n- or p-) "effective" conductivity type if, during normal operation of the device, the predominant mobile charge carriers in the semiconductor region are of the given conductivity type. Thus, in a region of effective n-type the predominant mobile charge carriers during normal device operation are electrons, and in a region of effective p-type the predominant charge carriers during normal device operation are holes.

It will be noticed that a semiconductor region of a given effective conductivity type can be, but need not be, of the same dopant conductivity type. A well known example of the situation where a semiconductor region is of one dopant conductivity type and of the other effective conductivity type is the channel region of a n-channel field effect transistor (FET), which is typically formed in p-doped semiconductor material, i.e., in material that is of p-type dopant conductivity type. However, during normal operation of the device the predominant mobile charge carriers in the channel region are electrons. The channel region thus is of effective n-conductivity type.

As those skilled in the art know, the effective type of a semiconductor region is determined by the type of electrical contact provided to the region. A contact conventionally is referred to as n-type (p-type) if, during normal device operation, it provides, respectively, an ohmic flow of electrons (holes) into or out of the region. An example of an n-type contact is a semiconductor region heavily doped with donors, exemplarily the source and drain regions of a n-channel FET.

By "first conductivity type carriers" we mean charge carriers that are the majority carriers in a region of the first effective conductivity type. An analogous definition applies for "second conductivity type carriers". For instance, if the first effective conductivity type is n-type then the first conductivity type carriers are electrons. Charge carriers herein are "hot" charge carriers in a given semiconductor region that is of (lattice) temperature T is said charge carriers in the region have a distribution in energy, with the distribution being at least approximately described by a mathematical expression that comprises a Boltzmann factor that contains an effective temperature $T^*$, with $T^* > T$. Typically $(T^* - T)/T$ is at least 0.1.

A semiconductor region herein is "undoped" if it is either actually undoped (i.e., no dopants are detectable in the material of the region), or if it is not intentionally doped (i.e., dopant atoms are detectable in the material of the region but these atoms were not intentionally introduced into the material). The term "undoped" thus is herein synonymous with "undoped or not intentionally doped."

SUMMARY OF THE INVENTION

In a broad aspect the invention is an article that comprises a novel light emitting semiconductor device. In currently preferred embodiments the structure of the novel device resembles that of the above mentioned RST electronic device. Significantly, however, the novel device comprises a barrier region intermediate an effective n-type and an effective p-type semiconductor region, whereas in the prior art RST devices the barrier region separates two semiconductor regions of the same (either n or p) effective conductivity type.

More specifically, an article according to the invention comprises a semiconductor light emitting element that comprises a first semiconductor region (herein the "emitter") of a first effective conductivity type and a second semiconductor region that comprises material of a second effective conductivity type different from the first effective conductivity type. The article also comprises means for making electrical contact with the element such that an electrical current can be caused to flow between the first and second semiconductor regions, resulting in light emission through electron/hole recombination in at least a part of the second region. The portion of the device in which substantially all of the recombination occurs will generally be referred to as the "active region". Significantly, the element further comprises a third semiconductor region (herein the "barrier") intermediate the first and second semiconductor regions, the third region comprising undoped semiconductor material. Associated with the first and second semiconductor regions are a first and at least a second (not necessarily different) bandgap, and associated with the material of the third semiconductor region is a third bandgap that in general is larger than both the first and the second bandgap, with the relationships between the first, second and third bandgaps being such that the barrier region is effective to suppress the injection into the barrier of cold majority carriers from the first region and of majority carriers from the second region. Band discontinuities of at least several (exemplarily at least 4) kT are required for this purpose. Herein, k is the Boltzmann constant. Exemplarily, if the emitter region is of effective n-type and the second semiconductor region comprises material of effective p-type then, at the emitter/barrier interface, the barrier layer material must have a higher conduction band edge than the emitter region material, and at the barrier/second region interface, the barrier layer material must have a lower valence band edge than the second region material. On the other hand, if the emitter region is of effective p-type conductivity and the second semiconductor region comprises material of effective n-type then, at the emitter/barrier interface, the barrier layer material must have a lower valence band edge than the emitter region material and, at the barrier/second region interface, the barrier layer material must have a higher conduction band edge than the second region material.

The means for making electrical contact with the element comprise at least two spaced apart means for making electrical contact to the first semiconductor region, and further comprise means for making electrical contact to the second semiconductor region.

In a particular exemplary embodiment the novel device is an edge emitting laser. In another embodiment it is a vertical cavity surface emitting laser (VCSEL), preferably a VCSEL with at least one multilayer mirror that comprises dielectric material. The device can serve as a logic element having electrical inputs and an optical output. In an embodiment with at least three, typically symmetrically arranged, emitter electrodes the novel logic element can provide a logic function that is complementary to that provided by a NORAND element of the '708 patent application. Still other embodiments are possible. For instance, a particular device according to the invention can simultaneously emit radiation at two distinct, predetermined wavelengths.

Devices according to the invention can be embodied in a variety of semiconductor systems, including "long wavelength" materials (adapted for emission of radiation of wavelengths longer than about 1.5 μm). Typically the materials will be III-V semiconductors. A necessary requirement is that the required heterostructure can be grown epitaxially, and that the majority carrier band of the emitter material has a sufficiently larger (typically) > 100 meV) band edge discontinuity relative to the barrier material so as to suppress uncontrolled injection of cold carriers. A further requirement is the existence of a sufficiently large (e.g., > 100 meV) band edge discontinuity at the barrier/second region interface such that majority carrier injection from the second region into the barrier (and the emitter) at normal device operating temperatures (e.g., 0°–100° C.) is suppressed. It is further desirable that the bandgap of the barrier material be larger than that of the active region by at least about 50 meV. This can help to suppress absorption in the barrier of the radiation emitted in the active layer. Similarly, in some cases it is desirable that the bandgap of the emitter material be larger than that of the active layer; however this is not a necessary requirement and in some applications, especially for VCSEL, it may be relaxed if the emitter layer is sufficiently thin. The gain-loss budget considerations in the design of semiconductor lasers are well-known in the art, see, e.g. the above cited article by Iga et al. Exemplary of III-V systems useful for the practice of the invention are a variety of quarternary InGaAsP as well as ternary InAlAs/InGaAs heterostructures lattice matched to InP, and combinations thereof. The discussion below will be primarily in terms of the InP/InGaAs system. This is for the sake of concreteness only and does not imply any limitation.

No attempt has been made to show exact dimensions and/or proportions.

DETAILED DESCRIPTION OF SOME PREFERRED EMBODIMENTS

Figure 1:
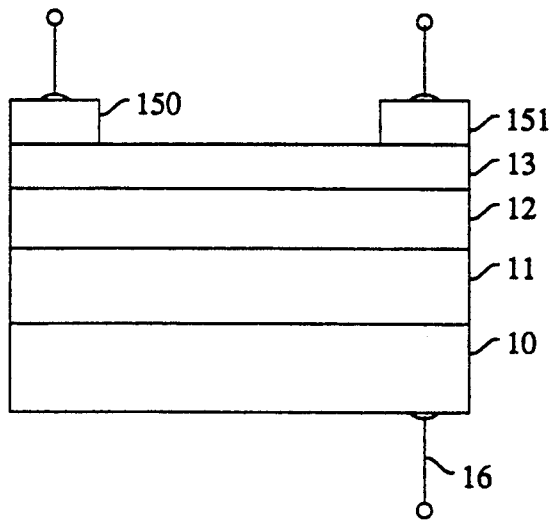
FIG. 1 schematically shows an exemplary RST device according to the invention.

FIG. 1 schematically depicts an exemplary device according to the invention, wherein numeral 10 refers to the "collector" (exemplarily p+ InP) which constitutes at least a portion of the second semiconductor region, numeral 13 refers to the emitter (exemplarily n− InGaAs), and 12 refers to the barrier (exemplarily undoped InP). Numerals 150,151 and 16 refer, respectively, to the first and second emitter contacts (which can interchangeably be referred to as "source" and "drain") and the collector contact. Numeral 11 refers to the active region, whose composition is chosen such that electron/hole recombination can take place in this region. The "second region" is considered to comprise the collector and the active region. Region 11 is of the effective conductivity type opposite that of region 13 (e.g., p InGaAs). Thus, 11 could be undoped or not intentionally doped. Region 11 optionally can comprise a sublayer whose composition differs from that of the remainder of the second region, as will be discussed in more detail below. It will be appreciated that FIG. 1 is intended to present only the general layer structure and is not meant to be an accurate representation of a particular device according to the invention.

Figure 2:
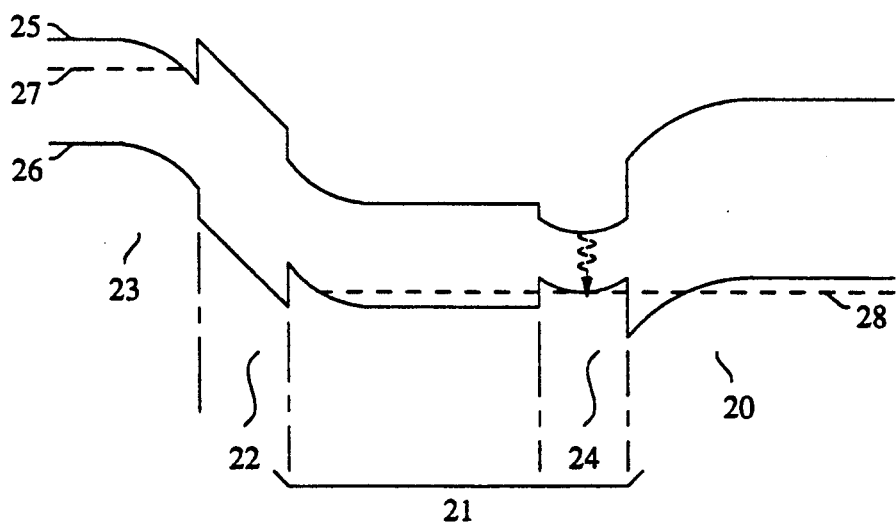
FIG. 2 shows the relevant portion of the energy band diagram of a device of the type shown in FIG. 1.

FIG. 2 schematically depicts relevant features of the band diagram associated with an inventive InP/InGaAs device that contains an optional sublayer whose composition is such that it has a smaller bandgap than any other second region material.

Such a sublayer is merely one of the multitude of possible active layer structures known in the art. Exemplary, other known active layer structures that can be incorporated into devices according to the invention are quantum well structures such as graded-index single or multiple quantum-well structures. (See, for example G. P Agrawal and N. K. Dutta, "Long-wavelength Semiconductor Lasers", Van Nostrand, 1986, Chapter 9, incorporated herein by reference). A specially tailored active layer design may not offer substantial advantages for non-lasing light emitting devices that are also contemplated here. Even coherent sources may be designed with a simple homogeneous active layer; however, the introduction of specially designed sublayers may significantly reduce the laser threshold, as is known in the art.

Numeral 25 of FIG. 2 refers to the conduction band edge, 26 to the valence band edge, 27 to the electron Fermi level, and 28 to the hole Fermi level. The band diagram assumes a positively biased collector contact (16) relative to contacts 150 and 151, with no bias applied between the emitter contacts. As can be seen from FIG. 2, the bandgap in the barrier region 22 exceeds that in the emitter region 23, such that in the absence of a bias between the emitter contacts (i.e., $V_{SD}=0$) relatively few electrons can surmount the potential barrier at the emitter/barrier layer interface, even under substantial collector bias. The existence of a valence band discontinuity at the barrier layer/second region (consisting of regions 21 and 20) interface that serves to suppress flow of holes from the active region to the emitter is to be noted. Suppression of reverse carrier flow across this interface is considered to be an important design aspect.

Application of an appropriate bias voltage between the emitter contacts (i.e., $V_{SD}>0$) results in heating of the electrons in region 23, with some of the hot electrons spilling over the energy barrier into region 21. Recombination of these minority carriers with holes results in luminescence at the fundamental wavelength of the active layer material (e.g., 1.65 μm for $In_{0.57}Ga_{0.43}As$). If optional sublayer 24 is present then recombination will occur preferentially in the sublayer, and the emitted radiation will have longer wavelength.

When $V_{SD}$ exceeds a critical value $V_{CR}^{(1)}$ then the drain characteristic (i.e. $I_D$ versus $V_{SD}$, where $I_D$ is the current at the drain contact) shows negative differential resistance (NDR), and a high-field domain is formed in the emitter channel. The value of $V_{CR}^{(1)}$ depends on the emitter channel length (i.e., the distance between source and drain contacts) and the barrier height for charge injection. For instance, for a 1 μm channel length in a InP/InGaAs device $V_{CR}^{(1)}$ typically is $\lesssim 0.5$ V.

Increasing $V_{SD}$ above $V_{CR}^{(1)}$ leads to a rapid rise in the injection current ($I_C$). When $V_{SD}$ reaches another critical value ($V_{CR}^{(1)}$) the NDR regime ends and the device becomes stable. At this point, most of the source current ($I_S$) is injected over the barrier. The maximum injection current density per unit width of the emitter ($J_C^{max}$) (in the absence of avalanche effects) can be estimated to be about $\epsilon E_{br} v$, where $\epsilon$ is the barrier permittivity, $E_{br}$ is the dielectric strength of the barrier, and v is an effective high-field electron velocity in the emitter channel prior to RST. Assuming plausible values for these parameters one obtains $J_C^{max} \sim 3$ A/cm. The highest measured values of $J_C$ considerably exceed values according to the above estimation, suggesting that avalanche multiplication can occur in the barrier layer. Such multiplication is considered to be a beneficial effect that can result in increased light output of devices according to the invention. Accordingly, in some preferred embodiments of the invention the barrier layer thickness exceeds the relevant impact ionization distance in the barrier layer. The "impact ionization distance" herein is the distance parallel to an applied electric field that a carrier has to travel in a given semiconductor material in order to gain the minimum energy required for creation of an electron/hole pair in the material. The relevant applied field is the field that corresponds to normal bias conditions of the device.

Holes, created in barrier 12 by avalanche ionization, will be injected into emitter 13 and will combine there with electrons, resulting in luminescence. If the material of 13 has a bandgap that differs from that of active region 11 then the luminescence radiation from 13 will differ in wavelength from that from 11, and the device can simultaneously emit radiation of two predetermined wavelengths.

At least in some circumstances it is desirable that momentum transfer effects (e.g., Gunn effect) do not play a dominant role in the heating of emitter electrons. This can be assured if the emitter material is selected such that the relevant emitter/barrier layer energy barrier (e.g. the conduction band offset between emitter material and barrier material) is less than the energy difference between the relevant $\Gamma$-point energy extremum (e.g., the conduction band minimum $E_\Gamma$) and the nearest satellite extremum (e.g., the conduction band minimum $E_L$ in InGaAs). This condition is met, for instance, in $In_{0.53}Ga_{0.47}As/InP$, in which the conduction band offset $\Delta E_c$ is about 0.25 eV (the valence band offset $\Delta E_v$ is about 0.35 eV), and $E_\Gamma - E_L$ is about 0.55 eV.

Figure 3:
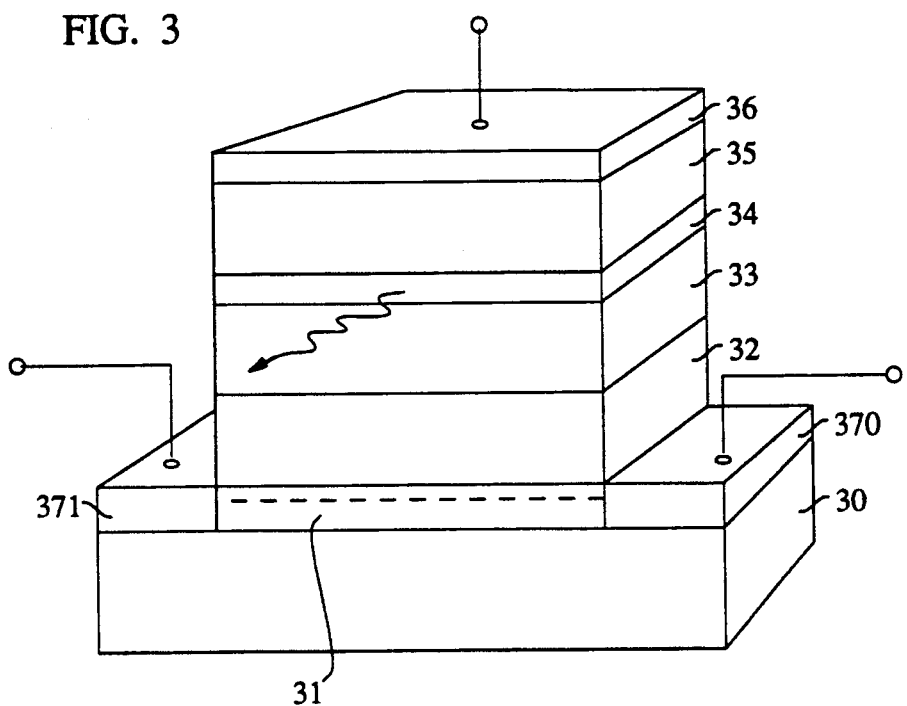
FIG. 3 schematically depicts a further exemplary RST device according to the invention that can serve as an edge emitting laser.

The invention can be embodied in devices that can emit coherent radiation as well as in devices whose radiation output is not coherent. An example of an edge emitting semiconductor laser according to the invention is schematically depicted in FIG. 3, wherein 30 refers to the substrate (e.g., n InP), 31 to the emitter channel (e.g., n-type InGaAs), 32 to the barrier layer (e.g., undoped InP), 34 to the optional strained layer of p-type InGaAs, 35 to the collector region (e.g., p-type InP), and 36 to the collector contact (e.g., p+InGaAs, followed by an appropriate known metallization layer). Region 33 (exemplarily p-type InGaAs) serves to cool the injected electrons. If the sublayer option is not exercised, then region 33 itself forms the optically active layer. As discussed above, devices according to the invention (including the device of FIG. 3) may comprise a variety of known active region designs, such as graded-index single or multiple quantum-well structure. Numerals 370 and 371 refer to the two emitter contacts, for instance, ion-implanted n-type regions. Implantation of a heavy dose of Si donors, followed by a metal (e.g., Au) evaporation is a preferred known technique of producing these contacts. Another possibility is to use alloyed Au-Ge contacts, as is well known in the art. FIG. 3 is intended to show the general layer structure of the device. Those skilled in the art will undoubtedly be aware of some further features that typically will have to be present in an actual embodiment according to FIG. 3. For instance, the doping level generally will not be uniform throughout layer 31 but may be substantially higher in a thin (e.g., 2.5 nm) region adjacent to 32 than it is in the remainder of 31, thereby facilitating the RST of electrons in the channel. Optional sublayer 34 need not be adjacent to the collector region but instead can be embedded within 33, possibly with step-wise or continuous compositional transition between 33 (exemplary composition $In_{0.53}Ga_{0.47}As$) and 34 (exemplary composition $In_{0.6}Ga_{0.4}As$). It will be recognized that it is not essential that an edge emitting laser according to the invention have the "collector-up" geometry of FIG. 3, and devices with "emitter-up" geometry are contemplated.

Figure 4:
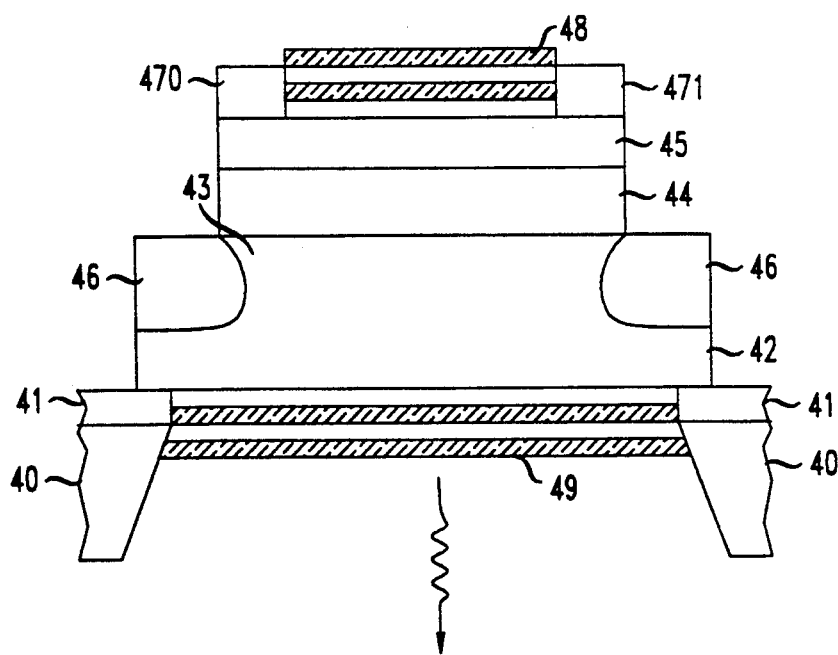
FIG. 4 shows schematically a still further embodiment of the invention, namely a VCSEL.

FIG. 4 schematically depicts a preferred embodiment of the invention, namely, a VCSEL. On InP substrate 40 is etch stop layer 41 (e.g., p-type InGaAs), which is followed by p-InP collector 42, p InGaAs active region 43, undoped InP barrier 44, and n InGaAs emitter 45. Lateral confinement of injected electrons in the active region is provided by p+ region 46, which exemplarily is doped by ion implantation. The collector contact (not shown) can be placed on the back of the wafer is a p-type substrate is used. This would permit the use of a common collector for an array of VCSEL devices. If system considerations require the use of a semi-insulating substrate, then layer 42 should be understood as a thick (more than 1 micron) highly conducting p-type InP layer, epitaxially grown on the substrate and contacted on the side of the SEL. Numerals 470 and 471 refer to the emitter contacts, and 48 and 49 refer to dielectric mirrors, exemplarily each consisting of a multiplicity of $Si/SiO_2$ layer pairs, with each layer having $\lambda/4$ optical thickness. Such mirrors are known and can have very high (>99%) reflectivity. See, for instance, D. G. Deppe et al., *Applied Physics Letters*, Vol. 56, p. 2172 (1990). Prior to deposition of mirror 49 the InP substrate can be etched away by known V-groove techniques, stopping at layer 41, which then can also be removed with a known etchant.

As those skilled in the art will appreciate, a sublayer active region is currently not preferred in a VCSEL according to the invention, due to the inherent limit on the thickness of such a layer imposed by the conditions of pseudomorphic growth. However, as the art of VCSEL progresses, the losses due to incomplete mirror reflectivity and the diffraction at the mirror edges can be expected to be minimized, so that a thin active layer comprising (possibly strained) multiple-quantum-well layers, may become the preferred implementation.

In order to achieve low lasing threshold it is desirable that the emitter layer material have a somewhat larger bandgap (e.g., by more than about 50 meV) than the light emitting active region. Furthermore, it is desirable that each of the "cladding" layers (42 and 44) be relatively thin (e.g., about 50-200 nm), that the emitter layer be relatively thin (e.g., about 25-100 nm), and that the mirrors have high reflectivity such that reflection losses are less than 1%. Since charge injection efficiency generally decreases with increasing distance a between source and drain, it is desirable that a be relatively small, exemplarily $\lesssim 2$ $\mu$m, consistent with the requirement that the Fresnel number of the cavity be relatively large, preferably at least about 2. As is well known, the Fresnel number for the "cavity" of FIG. 4 can be defined to be $a^2/\lambda L$, where L is the distance between mirrors 48 and 49, and $\lambda$ is the lasing wavelength in the cavity medium.

Considerations based on the Fresnel number are relevant to the planar-mirror unguided-wave vertical cavities that are currently state of the art. Confocal cavities using mirrors with curved surfaces are well known in laser optics. Anticipated development of such cavities for VCSEL applications would substantially relax the diffraction-loss constraint. A particularly desirable development in the context of this invention is the anticipated perfection of guided-wave vertical-cavity resonators that can be expected to almost totally suppress the diffraction loss at the mirrors of small (submicron) lateral dimension. Thus, the above recited limits are appropriate for current technology and should not be considered to constitute absolute limits.

The following is an exemplary method of making a light emitting device according to the invention. On a conventional p InP substrate of resistivity 0.001 $\Omega$cm are deposited in sequence: a 1 $\mu$m thick p + ($10^{18}$ cm$^{-3}$ Be) InP collector layer, a 0.1 $\mu$m p ($10^{16}$ cm$^{-3}$ Be) $In_{0.53}Ga_{0.47}As$ active layer, a 0.3 $\mu$m not intentionally doped InP barrier layer, a 50 nm n-type lattice-matched InGaAsP (fundamental wavelength = 1.55 μm) emitter layer whose top 2.5 nm are doped n+ ($10^{18}$ cm$^{-3}$ Si) with the remainder being n- ($10^{17}$ cm$^{-3}$ Si), a 50 nm n+ (about $10^{19}$ cm$^{-3}$ Sn) InP cap layer, and a 0.2 μm n+ ($10^{19}$ Sn)InGaAsP contact layer. Deposition can be by conventional means well known to those skilled in the art. By means of conventional photolithography and etching techniques a 1 μm wide channel is opened between source and drain regions in the cap layer, and the lateral dimension of the device defined by formation of a 5 μm wide mesa, with the channel centered thereon. A 300 nm $SiO_2$ layer is deposited on the wafer, about 1 μm wide windows opened in the $SiO_2$ layer over the source and drain contact regions, and a patterned layer of Au deposited to provide electrical contact to the emitter contact regions. These steps, as well as other processing techniques that can be used, are conventional. After dicing and cleaving a thus produced wafer in known manner and application of a source-collector bias of about 5 volt and of $V_{SD}$ of about 1.5 V to one of the thus produced devices, light emission from the device is expected to occur.

Devices according to the invention can serve as logic elements. Such an element has electrical inputs and an optical output. Designation one of the emitter terminals (exemplarily of a device according to FIG. 1) as terminal $X_1$ and the other as terminal $X_2$, using logic 0 and 1 in conventional fashion for the input terminals, and identifying light output L from the device with output state 1 (and the substantial absence of light output with output state 0), Table 1 demonstrates that associated with the device is the logic function EXCLUSIVE OR (XOR).

TABLE I

| $X_1$ | $X_2$ | L |
|---|---|---|
| 1 | 1 | 0 |
| 1 | 0 | 1 |
| 0 | 1 | 1 |
| 0 | 0 | 0 |

Devices according to the invention can have more complex truth tables. For instance, if three, appropriately arranged, emitter contacts are provided, (arranged, for instance, in the manner shown in FIG. 3 of the application Ser. No. 514,078), and if the third contact is designated $X_3$, then the transformation provided by the device is described by the truth table of Table II.

TABLE II

| $X_1$ | $X_2$ | $X_3$ | L |
|---|---|---|---|
| 1 | 1 | 1 | 0 |
| 1 | 0 | 1 | 1 |
| 0 | 1 | 1 | 1 |
| 0 | 0 | 1 | 1 |
| 1 | 1 | 0 | 1 |
| 1 | 0 | 0 | 1 |
| 0 | 1 | 0 | 1 |
| 0 | 0 | 0 | 0 |

The logic function represented by this truth table is the complement of the NORAND function of the application Ser. No. 514,078. The element according to the invention gives L = OR ($X_1, X_2$) when $X_3 = 0$, and gives L = NAND ($X_1, X_2$) when $X_3 = 1$. Such a logic element is expected to have important optoelectronic applications, exemplarily in optical computing and/or optical communications. For instance, such an element can be used to construct a self-organizing logic.

As those skilled in the art will recognized, the above truth table is unlike that of any previously known logic element, and could previously only be obtained by a combination of two or more prior art logic elements. It is proposed that this novel logic function be termed "ORNAND". It is expected that logic elements according to the invention will find use in a variety of applications, e.g., in high speed computers or signal processors.

I claim:

1. An article comprising a semiconductor light-emitting element that comprises
   a) a first semiconductor region (to be referred to as the "emitter") comprising a semiconductor region of a first effective conductivity type;
   b) at least two spaced apart means for making electrical contact to the first semiconductor region;
   c) a second semiconductor region of a second effective conductivity type that differs from the first effective conductivity type, the means of b) being spaced from the second semiconductor region, associated with said first and second semiconductor regions being a first and at least a second bandgap, respectively, with the first bandgap not necessarily being different from the second bandgap;
   d) means for making electrical contact to the second semiconductor region; and
   e) a third semiconductor region intermediate the first and second semiconductor regions, the third semiconductor region (to be referred to as the "barrier") comprising undoped semiconductor material whose bandgap is such that under normal forward bias conditions a potential barrier for first conductivity type carriers exists between the emitter and the third semiconductor region, such that a potential barrier for second conductivity type carriers exists between the second and the third semiconductor region, and such that under said normal forward bias conditions a current that comprises hot charge carriers of the first conductivity type can flow from the first to the second semiconductor region, essentially without a simultaneous flow of charge carriers of the second conductivity type from the second to the first semiconductor region.

2. An article according to claim 1, wherein the light-emitting element is a laser.

3. An article according to claim 2, wherein the laser is a vertical cavity surface emitting laser (VCSEL).

4. An article according to claim 3, wherein the VCSEL comprises at least one multilayer reflecting means that comprises at least one dielectric layer, said reflecting means positioned such that essentially none of the charge carriers of the first conductivity type that flow from the first to the second semiconductor region traverse said reflecting means.

5. An article according to claim 1, wherein the light-emitting element comprises III-V semiconductor material.

6. An article according to claim 5, wherein the light-emitting element comprises InP.

7. An article according to claim 1, wherein the first effective conductivity type is n-type.

8. An article according to claim 1, wherein the barrier has a thickness that exceeds an impact ionization distance of first conductivity type carriers in the barrier under normal forward bias conditions.

9. The article of claim 1, wherein the article comprises a multiplicity of said light emitting elements situated on common semiconductor substrate means.

10. The article of claim 1, further comprising means for applying electrical bias to said element, and means responsive to the light emitted by the light-emitting element.

11. The article of claim 10, wherein the light emitting element is a logic element, and the light-responsive means comprise a further logic element whose electrical state depends on the electrical state of the light emitting element.

12. The article of claim 10, wherein the light emitting element is a logic element that comprises at least three spaced apart means for making electrical contact to the first semiconductor region.

* * * * *